(12) United States Patent
Chen

(10) Patent No.: US 10,431,763 B2
(45) Date of Patent: Oct. 1, 2019

(54) LIGHT EMITTING DIODE AND PREPARATION METHOD THEREOF, ARRAY SUBSTRATE AND ELECTRONIC DEVICE

(71) Applicant: BOE Technology Group Co., Ltd., Beijing (CN)

(72) Inventor: YuJu Chen, Beijing (CN)

(73) Assignee: BOE TECHNOLOGY GROUP., LTD., Beijing (CN)

( * ) Notice: Subject to any disclaimer, the term of this patent is extended or adjusted under 35 U.S.C. 154(b) by 0 days.

(21) Appl. No.: 15/927,544

(22) Filed: Mar. 21, 2018

(65) Prior Publication Data

US 2019/0165291 A1    May 30, 2019

(30) Foreign Application Priority Data

Nov. 29, 2017 (CN) .......................... 2017 1 1224640

(51) Int. Cl.
*H01L 29/06* (2006.01)
*H01L 51/50* (2006.01)
(Continued)

(52) U.S. Cl.
CPC ........ *H01L 51/502* (2013.01); *H01L 27/3246* (2013.01); *H01L 51/5209* (2013.01); *H01L 51/5225* (2013.01); *H01L 51/5293* (2013.01); *H01L 51/56* (2013.01); *G02F 1/1336* (2013.01); *H01L 51/006* (2013.01); *H01L 51/0021* (2013.01); *H01L 51/0035* (2013.01); *H01L 51/0036* (2013.01); *H01L 51/0037* (2013.01); *H01L 51/0043* (2013.01); *H01L 51/0058* (2013.01); *H01L 51/0059* (2013.01);

*H01L 51/0078* (2013.01); *H01L 51/0081* (2013.01); *H01L 51/5056* (2013.01);
(Continued)

(58) Field of Classification Search
CPC ........... H01L 31/035209; H01L 51/502; H01L 33/06; H01L 29/0669; H01L 21/02601
See application file for complete search history.

(56) References Cited

U.S. PATENT DOCUMENTS 8,902,384 B2 * 12/2014 Jeon ....................... G02F 1/174
349/112
9,564,608 B2 * 2/2017 Sato ........................ H01L 51/502
(Continued)

FOREIGN PATENT DOCUMENTS

CN    105044966    11/2015
CN    106356465    1/2017
(Continued)

OTHER PUBLICATIONS

Office Action from Chinese Patent Application No. 201711224640.0, dated Jan. 30, 2019, 19 pgs.

*Primary Examiner* — Hsien Ming Lee
(74) *Attorney, Agent, or Firm* — Westman, Champlin & Koehler, P.A.

(57) ABSTRACT

Provided are a light emitting diode and a preparation method thereof, an array substrate, and an electronic device. The light emitting diode comprises: a substrate, and a first electrode, a quantum rod light emitting layer and a second electrode disposed in lamination on the substrate, wherein, the quantum rod light emitting layer comprises a plurality of quantum rods which present a directional arrangement.

20 Claims, 5 Drawing Sheets

(51) Int. Cl.
   *H01L 51/52*       (2006.01)
   *H01L 27/32*       (2006.01)
   *H01L 51/56*       (2006.01)
   *H01L 51/00*       (2006.01)
   *G02F 1/13357*     (2006.01)

(52) U.S. Cl.
   CPC ...... *H01L 51/5072* (2013.01); *H01L 51/5088* (2013.01); *H01L 51/5092* (2013.01); *H01L 2251/558* (2013.01)

(56) References Cited

U.S. PATENT DOCUMENTS 9,958,724 B2  5/2018  Liu
2017/0271610 A1* 9/2017 Takahashi ........... H01L 51/5012

FOREIGN PATENT DOCUMENTS

| CN | 106356470 | 1/2017 |
| WO | WO 2008/129800 | 10/2008 |

* cited by examiner

LIGHT EMITTING DIODE AND PREPARATION METHOD THEREOF, ARRAY SUBSTRATE AND ELECTRONIC DEVICE

CROSS REFERENCE TO RELATED APPLICATION

The present application claims a priority benefit of Chinese Patent Application No. 201711224640.0, filed on Nov. 29, 2017, the entire contents thereof being incorporated herein by reference.

TECHNICAL FIELD

The embodiments of the present disclosure relate to a light emitting diode and a preparation method thereof, an array substrate and an electronic device.

BACKGROUND

Light emitting diode (LED) is more and more widely used in lighting devices and display devices due to its advantages of low energy consumption, less heat generation, long lifetime and the like. There are inevitable problems in the packaging technology and service life of organic light emitting diode (OLED) in LEDs. Quantum dots (QDs) or quantum rods (QRs) have advantages of high light color purity, high luminescence quantum efficiency, tunable color of light emitted, long service life and the like, and become a research focus in current LED light emitting materials. Therefore, it becomes a main research direction of current research on new LED to use quantum dots or quantum rods as the quantum dot/rod light emitting diode (QLED) of a light emitting layer. Quantum dot/rod light emitting diode (QLED) has a wide application prospect in the technical fields of lighting and display.

Quantum rod is similar to quantum dot, and has optical properties such as light absorbing property and light emitting property. The wavelength of a light emitted by quantum rod is associated with the size and material of the quantum rod. The wavelength of a light emitted by quantum rod can be controlled by adjusting the size and material of the quantum rod, and may cover the whole wavelength range of visible light.

SUMMARY

At least one embodiment of the present disclosure provides a light emitting diode comprising: a substrate, and a first electrode, a quantum rod light emitting layer and a second electrode disposed in lamination on the substrate, wherein, the quantum rod light emitting layer comprises a plurality of quantum rods which present a directional arrangement.

For example, in the light emitting diode provided in at least one embodiment of the present disclosure, the directional arrangement comprises a directional arrangement in which the plurality of quantum rods are in parallel with a plane of the substrate, a directional arrangement in which the plurality of quantum rods are acute-angled to the plane of the substrate, or a directional arrangement in which the plurality of quantum rods are perpendicular to the plane of the substrate.

For example, in the light emitting diode provided in at least one embodiment of the present disclosure, an aspect ratio of each of the quantum rods is 2 to 50.

For example, the light emitting diode provided in at least one embodiment of the present disclosure further comprises a third electrode and a fourth electrode, wherein, the third electrode and the fourth electrode are configured to generate an electric field in parallel with or substantially in parallel with a plane of the substrate in a powered state.

For example, in the light emitting diode provided in at least one embodiment of the present disclosure, the third electrode and the fourth electrode are disposed in the same layer and both are slit-shaped electrodes, and the third electrode and the fourth electrode are disposed oppositely and are staggered.

For example, in the light emitting diode provided in at least one embodiment of the present disclosure, the third electrode and the quantum rod light emitting layer are disposed in the same layer or in different layers.

For example, in the light emitting diode provided in at least one embodiment of the present disclosure, the third electrode and the fourth electrode are disposed in different layers, the third electrode is a slit-shaped electrode, and the fourth electrode is a plate-shaped electrode.

For example, in the light emitting diode provided in at least one embodiment of the present disclosure, the third electrode and the quantum rod light emitting layer are disposed in the same layer, or the third electrode and the fourth electrode are disposed on one side of the quantum rod light emitting layer close to the substrate.

For example, the light emitting diode provided in at least one embodiment of the present disclosure further comprises a fifth electrode, wherein the fifth electrode and the first electrode generate an electric field in parallel with or substantially in parallel with a plane of the substrate in a powered state.

For example, in the light emitting diode provided in at least one embodiment of the present disclosure, the first electrode and the fifth electrode are disposed in different layers, the first electrode is a slit-shaped electrode, and the fifth electrode is a plate-shaped electrode.

For example, in the light emitting diode provided in at least one embodiment of the present disclosure, the first electrode comprises a first sub-electrode and a second sub-electrode, wherein the first sub-electrode and the second sub-electrode are disposed in the same layer, and are configured to generate an electric field in parallel with or substantially in parallel with a plane of the substrate in a powered state.

For example, the light emitting diode provided in at least one embodiment of the present disclosure further comprises a functional layer positioned between the first electrode and the quantum rod light emitting layer or between the second electrode and the quantum rod light emitting layer, wherein, the functional layer comprises at least one of a hole injection layer, a hole transport layer, an electron injection layer and an electron transport layer.

For example, in the light emitting diode provided in at least one embodiment of the present disclosure, the first electrode is disposed between the substrate and the hole injection layer, and the second electrode is disposed on one side of the electron transport layer away from the substrate.

At least one embodiment of the present disclosure also provides a light emitting diode array substrate comprising any light emitting diode described above.

For example, the light emitting diode array substrate provided in at least one embodiment of the present disclosure further comprises a pixel defining layer, wherein, the pixel defining layer comprises a groove, and the quantum rod light emitting layer is formed in the groove.

At least one embodiment of the present disclosure also provides an electronic device comprising any light emitting diode array substrate described above.

At least one embodiment of the present disclosure also provides a preparation method of a light emitting diode, comprising: providing a substrate; and forming a first electrode, a quantum rod light emitting layer and a second electrode in lamination on the substrate; wherein, the quantum rod light emitting layer comprises a plurality of quantum rods which present a directional arrangement.

For example, the preparation method provided in at least one embodiment of the present disclosure further comprises forming a third electrode and a fourth electrode on the substrate, wherein, the third electrode and the fourth electrode are configured to generate an electric field in parallel with or substantially in parallel with a plane of the substrate in a powered state.

For example, the preparation method provided in at least one embodiment of the present disclosure further comprises forming a functional layer positioned between the first electrode and the quantum rod light emitting layer or between the second electrode and the quantum rod light emitting layer on the substrate, wherein, the functional layer comprises at least one of a hole injection layer, a hole transport layer, an electron injection layer and an electron transport layer.

For example, in the preparation method provided in at least one embodiment of the present disclosure, the quantum rod light emitting layer is formed with a coating or inkjet process, and an electric field in a predetermined direction is applied such that the plurality of quantum rods in the quantum rod light emitting layer present a directional arrangement, then the quantum rod light emitting layer is dried and solidified to fix the directional arrangement of the quantum rods in the quantum rod light emitting layer.

BRIEF DESCRIPTION OF DRAWINGS

To more clearly illustrate the technical solutions of the embodiments of the present disclosure, the drawings of the embodiments will be briefly described below. Obviously, the drawings in the following description are only some embodiments of the present invention, but are not intended to limiting the present invention.

DETAILED DESCRIPTION

Figure 1:
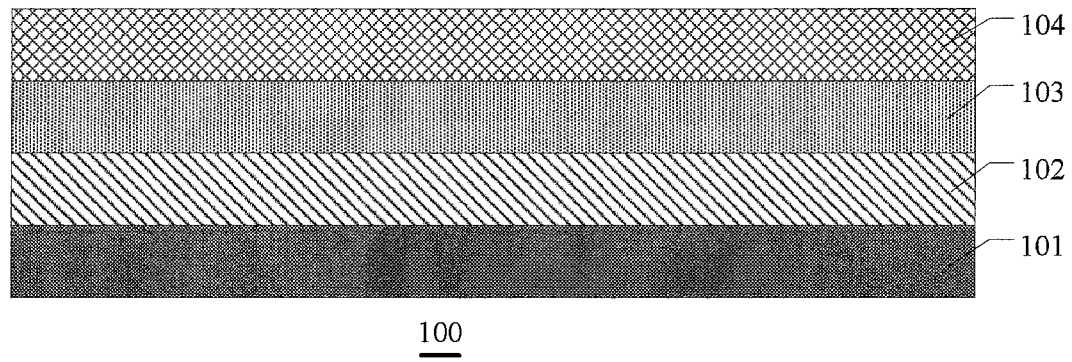
FIG. 1 is a schematic sectional view of a light emitting diode provided in one embodiment of the present disclosure.

In order to make the objects, technical solutions and advantages of the present invention more clear, the technical solutions of the embodiments of the present invention will be described in detail below with reference to the drawings of the embodiments. Obviously, the embodiments described are only a part of, but not all of the embodiments of the present invention. All of other embodiments obtained by those skilled in the art based on the embodiments described, without inventive efforts, fall within the protection scope of the present invention.

Unless otherwise defined, the technical terms or scientific terms used in the present disclosure should have usual meanings understood by a person of ordinary skills in the art. The words "first", "second" and the like used in the present disclosure do not indicate any order, number or importance, and are merely intended to distinguish different components. The word "comprise" or "include" or the like means the element or article present before this word encompasses the element or article listed after this word or an equivalent thereof, without excluding other element or article. The word "connect" or "link" or the like is not limited to a physical or mechanical connection, and may comprise an electrical connection, whether directly or indirectly. The words "above", "below", "left", "right" and the like are only used to indicate relative position relationship. When the absolute position of the object referred to is changed, the relative position relationship may be changed accordingly.

Natural light can be regarded as a mixture of various polarized lights. Currently, a plane polarized light is mainly produced in the manners of reflection, multiple refraction, birefraction and selective absorption. For example, during the preparation of a liquid crystal display panel, it is usually required to add a polarization coating layer or attach a polarizer layer on the surface of the display panel to make the light present a polarization state. However, when the polarizer is used to polarize a light, the intensity of the light will be reduced, thereby reducing the utilization factor of the backlight source and increasing the energy consumption.

Quantum rod/dot light emitting diode (QLED) can produce an exciting light through the recombination of a pair of electron and hole. In comparison with quantum dot, the longer shape of quantum rod allows quantum rod to have optical properties which quantum dot does not have. For example, quantum rod has a property of emitting a polarized light. Quantum rod itself can produce a polarized light under the action of an electric field. For example, quantum rod can emit a polarized light which is in parallel with its major axis and perpendicular to its minor axis, and quantum rod may be applied in a polarization light source generating equipment without the defect of reduced light intensity. Therefore, how to make a quantum rod light emitting layer formed from a plurality of quantum rods have a polarization property is one of the research focuses of the present disclosure.

The inventors find that a light emitting layer formed from a plurality of quantum rods and having a polarization property can be obtained by generating an electric field in a predetermined direction (for example, an electric field in parallel with or substantially in parallel with the substrate) through electrode design, to allow the plurality of quantum rods to be arranged directionally, and then fixing the plurality of quantum rods to keep them in directional arrangement (for example, allowing wet printed quantum rods to be arranged directionally with a horizontal electric field, and then drying the directionally arranged quantum rods to fix the quantum rods so as to keep them in directional arrangement). This operation method is simple and has a low production cost. When the directionally arranged quantum rods formed with the method are applied in a light emitting diode, and then the light emitting diode is applied in a display device, a polarized light, for example, used for 3D display in a polarized light mode or used as a backlight source of a liquid crystal display panel, can be produced, while an image display with high luminance and high color gamut can be achieved. When the light emitting diode is applied in a lighting device, for example, in outdoor lighting or automotive lighting, the luminance of lighting can be improved.

It should be noted that quantum rod is an one dimensional material which is affected by the quantum confinement effect in directions of two dimensions, and quantum rod is a crystal material with a size in axial direction of, for example, 10 nm to 100 nm.

At least one embodiment of the present disclosure provides a light emitting diode. For example, FIG. 1 is a schematic sectional view of a light emitting diode provided in one embodiment of the present disclosure. As shown in FIG. 1, the light emitting diode 100 comprises a substrate 101 and a first electrode 102, a quantum rod light emitting layer 103 and a second electrode 104 disposed in lamination on the substrate 101. The quantum rod light emitting layer 103 is disposed between the first electrode 102 and the second electrode 104 to form a sandwich structure, constituting a light emitting diode lamination. When a driving voltage is applied to the first electrode 102 and the second electrode 104, the quantum rod light emitting layer 103 will produce a light under excitation. The quantum rod light emitting layer 103 comprises a plurality of quantum rods, and the plurality of quantum rods present a directional arrangement.

For example, the plurality of quantum rods may be formed in the light emitting diode by vapor deposition method, sputtering method, printing method, coating method, spraying method or electron beam method.

Figure 2:
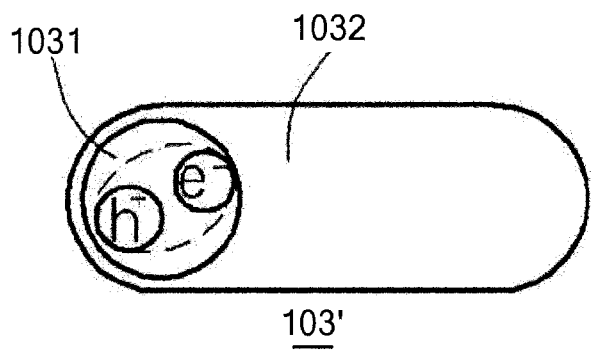
FIG. 2 is a structural schematic diagram of a quantum rod provided in one embodiment of the present disclosure.

For example, FIG. 2 is a schematic structural diagram of a quantum rod provided in one embodiment of the present disclosure. The quantum rod (QR) 103' may comprise a core 1031 and a shell 1032 surrounding the core 1031. The core 1031 may have a spherical shape, an ellipsoidal shape, a polyhedron shape or a rod shape. Here, the shell 1032 surrounding the core 1031 has a rod shape with a major axis and a minor axis. The major axis of the quantum rod refers to an axis along the length direction of the shell 1031 of the QR, and the minor axis of the quantum rod refers to an axis perpendicular to the major axis of the quantum rod. For example, the ratio of the minor axis to the major axis of the shell may be about 1:2 to 1:50. In a sectional view along the minor axis of the quantum rod, the QR may have a circle shape, an ellipse shape or a polygon shape. In FIG. 2, the quantum rod has a circle shape in the sectional view along its minor axis.

For example, the shell of the quantum rod may have a single layer structure or a multi-layer structure.

It should be noted that the quantum rod may also have a structure having a core only, without a shell. In this case, the core may be cylindrical, cylindroid, rod-shaped, or the like.

For example, the quantum rod in the quantum rod light emitting layer 103 is one or more selected from the group consisting of red quantum rod, green quantum rod and blue quantum rod. The quantum rod may be a Group II-VI quantum rod series, a Group III-VI quantum rod series, or a perovskite structure quantum rod series. For example, the quantum rod has a core-shell structure composed of a compound formed from Group II-VI elements. The core and shell of the quantum rod are formed from a semi-conductor material. For example, the material forming the core and the shell of the quantum rod is at least one of CdSe, ZnS, CdS, ZnTe, CdSe, CdTe, ZnO, ZnSe, HgSe, HgTe, CdZnTe, InP, InN, GaN, InSb, InAsP, InGaAs, GaAs, GaP, GaSb, AlP, AlN, AlAs, AlSb, CdSeTe, ZnCdSe, PbSe, PbTe, PbS, $CsPbI_3$ and PbSnTe. However, the material of the shell of the quantum rod has a higher band gap than that of the core, or the core is formed from a combination of various compounds, and the shell is formed from a material with the highest band gap among the materials of the core.

Exemplarily, the core is prepared from a mixed semi-conductor material of ZnS and CdS, and the shell is prepared from ZnS. For example, ZnS semi-conductor material can emit a blue light with a wavelength of 450 nm to 480 nm, and a core-shell structure quantum rod formed with the above structure can enable a blue light emission.

Exemplarily, the core is prepared from a mixed semi-conductor material of $CsPbI_3$ and CdSe, and the shell is prepared from CdS. A core-shell structure quantum rod formed from the materials can enable a green light emission.

Exemplarily, the core is prepared from a CdSe semi-conductor material, and the shell is prepared from CdS. For example, a core-shell structure quantum rod formed from the materials can enable a red light emission.

Exemplarily, by adjusting process parameters and the like to control particle diameter of quantum dots, a quantum rod formed from the quantum dots can be allowed to emit a light with corresponding color.

Figure 3:
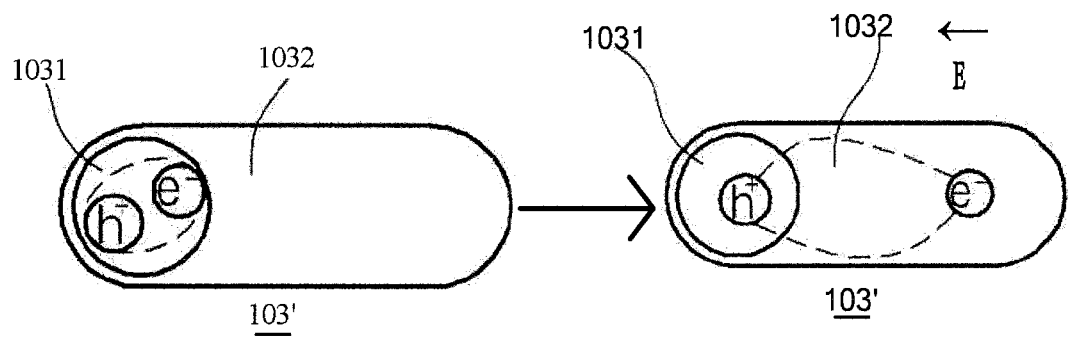
FIG. 3 is a schematic diagram showing a driving principle of a quantum rod provided in one embodiment of the present disclosure.

For example, FIG. 3 is a schematic diagram showing a driving principle of a quantum rod provided in one embodiment of the present disclosure. In the case that no electric field is applied to a quantum rod comprising a core and a shell, a hole "$h^+$" and an electron "$e^-$" are recombined in the core. When an electric field "E" along the major axis direction is applied to the quantum rod, the hole "$h^+$" and the electron "$e^-$" will be separated in space, thereby achieving a light emission of the quantum rod.

The quantum rod has a high quantum efficiency, and may produce a very strong fluorescence. The wavelength of the fluorescence produced varies as the size and material of the quantum rod vary. The larger the size of the quantum rod, the shorter the wavelength of the fluorescence produced is. Therefore, lights with various wavelength in the visible light region can be produced by adjusting the size and material of the quantum rod.

For example, in the light emitting diode provided in at least one embodiment of the present disclosure, the directional arrangement comprises a directional arrangement in which the plurality of quantum rods 103' are in parallel with a plane of the substrate 101, a directional arrangement in which the plurality of quantum rods 103' are acute-angled to the plane of the substrate 101, or a directional arrangement in which the plurality of quantum rods 103' are perpendicular to the plane of the substrate 101.

It should be noted that although a single quantum rod has a polarization property, a plurality of quantum rods may not ultimately produce a polarized light, rather they may produce a natural light formed by mixing various polarized lights, if the plurality of quantum rods are randomly mixed with each other without presenting a directional arrangement, in other words, if the plurality of quantum rods are not regularly arranged along the same or substantially the same direction. The direction of the directional arrangement of the plurality of quantum rods is not limited in the embodiments of the present disclosure, as long as the arrangement directions of the plurality of quantum rods are consistent to as a whole allow the formation of a polarized light.

Under the action of an electric field, the plurality of quantum rods are excited by the electric field to produce electron-hole pairs. Since the electron transitioning from valence band to conduction band is in a non-equilibrium state, it will transition from the conduction band back to the valence band to cause a recombination. During the transition, a photon will be produce when the electron transitions from the conduction band directly to the valence band, as a result, the quantum rod light emitting layer can produce a polarized light under the action of the electric field.

For example, the aspect ratio of each of the quantum rods is about 2 to 50. For example, the aspect ratio of the quantum rod is 2, 5, 10, 20, 30, 40 or 50. This is not limited in the embodiments of the present disclosure, as long as the quantum rod can emit a polarized light. When the aspect ratio of the quantum rod is less than 2, a problem that the polarization property of the quantum rod is not obvious will occur. When the aspect ratio of the quantum rod is greater than 50, since the quantum rod is similar with a fiber shape, it is difficult for the quantum rod to rotate when performing the directional arrangement, and the luminescence efficiency is poor.

During the preparation of the quantum rod light emitting layer, a coating process, an inkjet process or the like can be utilized to form the quantum rod light emitting layer. As the quantum rods are distributed in a dispersion, an electric field in a predetermined direction (for example, a horizontal electric field) can be applied at this time such that the plurality of quantum rods in the layer present a directional arrangement. After drying and solidifying the quantum rod light emitting layer, the directional arrangement of the quantum rods in the quantum rod light emitting layer is fixed, and subsequent electrode preparation process or the like can be performed on the quantum rod light emitting layer. The electric field in a predetermined direction (for example, a horizontal electric field) can be applied by external electrodes independent of the substrate for the quantum rod light emitting layer, or can be applied by electrodes prepared on the substrate. The mode of using external electrode will not be reiterated here, but the mode of forming electrodes on the substrate will be described below as an example.

Figure 4:
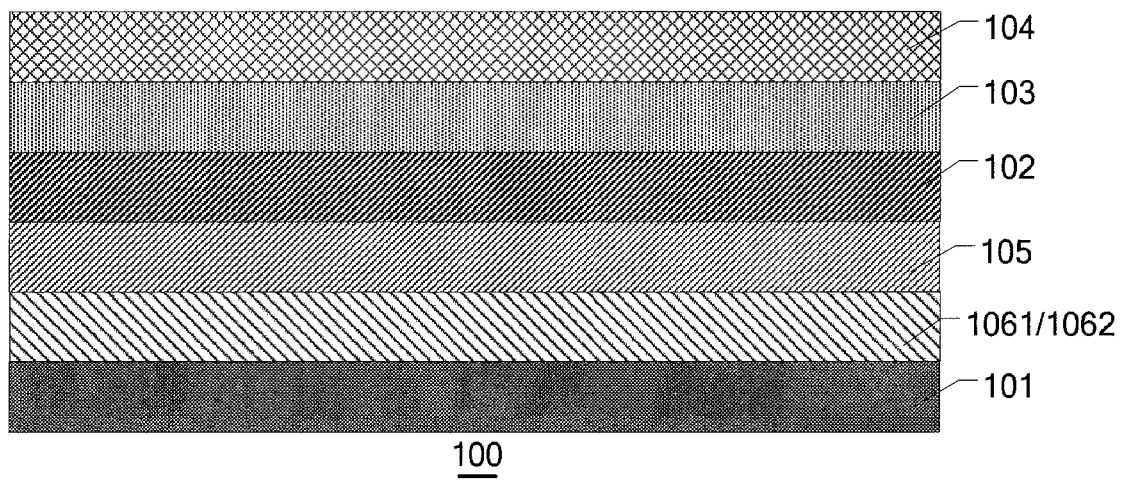
FIG. 4 is a schematic sectional view of another light emitting diode provided in one embodiment of the present disclosure.

For example, FIG. 4 is a schematic sectional view of another light emitting diode provided in one embodiment of the present disclosure. The light emitting diode 100 further comprises a third electrode 1061 and a fourth electrode 1062 disposed on the substrate 101. The third electrode and the fourth electrode are configured to generate an electric field in parallel with or substantially in parallel with a plane of the substrate 101 in a powered state, thereby allowing the plurality of quantum rods in the quantum rod light emitting layer to be arranged directionally.

Figure 5:
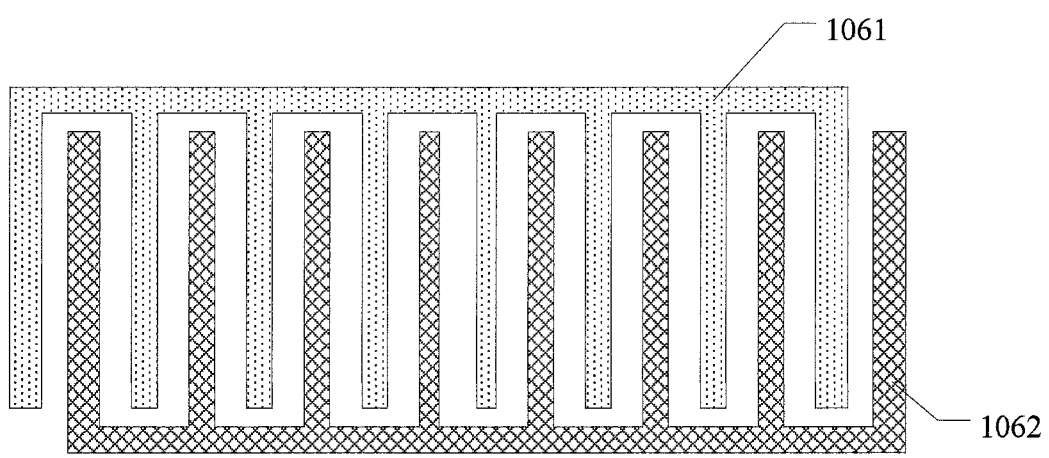
FIG. 5 is a schematic planar structural diagram of a third electrode and a fourth electrode provided in one embodiment of the present disclosure.

For example, one schematic planar structural diagram of the third electrode and the fourth electrode may be as shown in FIG. 5. FIG. 5 is a schematic diagram of an electrode structure similar with the display mode of in plane switching (abbreviated as IPS)/fringe field switching (abbreviated as FFS). With reference to FIG. 4 and FIG. 5, in one example, the third electrode 1061 and the fourth electrode 1062 are disposed in the same layer, and both are slit-shaped electrodes. The slit-shaped third electrode 1061 and fourth electrode 1062 are disposed oppositely and are staggered.

For example, the method for forming the third electrode 1061 and the fourth electrode 1062 comprises: depositing a conducting material layer on the substrate 101, and then patterning the conducting material layer with a photolithography or etching process to form patterns of the third electrode 1061 and the fourth electrode 1062. In each area, there are a plurality strips of parallel arranged third electrodes 1061 and parallel arranged fourth electrodes 1062. The third electrodes 1061 and the fourth electrodes 1062 are staggered and have gaps therebetween. Respective third electrodes 1061 are electrically connected with each other, and respective fourth electrodes 1062 are electrically connected with each other. The third electrodes 1061 connected together present a comb shape as a whole, and the fourth electrodes 1062 connected together present a comb shape as a whole as well. The third electrode 1061 and the fourth electrode 1062 after being powered can form an electric field in parallel with the surface of the substrate 101, and the parallel electric field can allow the plurality of quantum rods to be arranged directionally within a plane in parallel with the substrate. The third electrode 1061 and the fourth electrode 1062 may be, for example, electrically connected with a power supply by corresponding leads. For example, a high voltage is applied to the third electrode 1061 in operation, and a low voltage is applied to the fourth electrode 1062 in operation (or the fourth electrode 1062 is grounded).

For example, a first insulating layer 105 may be further disposed between the third electrode 1061 and the first electrode 102 to insulate them from each other.

For example, the third electrode 1061 and the fourth electrode 1062 may be formed with a transparent conducting material or a metal material. For example, the material forming the third electrode 1061 and the fourth electrode 1062 includes indium tin oxide (ITO), indium zinc oxide (IZO), indium gallium oxide (IGO), gallium zinc oxide (GZO), zinc oxide (ZnO), indium oxide ($In_2O_3$), aluminum zinc oxide (AZO), carbon nanotube and the like.

For example, in another embodiment, the third electrode 1061 and the fourth electrode 1062 positioned in the same layer may be disposed in a layer the same as or different from that of the quantum rod light emitting layer.

Figure 6:
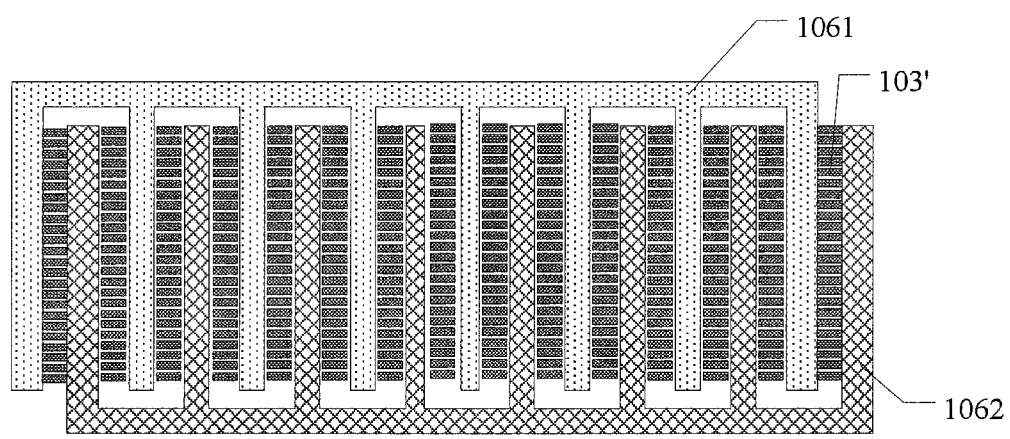
FIG. 6 is a schematic planar structural diagram of the third electrode and the fourth electrode in FIG. 5 with quantum rods filled therebetween.

As shown in FIG. 6, when the third electrode 1061 and the quantum rod light emitting layer 103 are disposed in the same layer, the plurality of quantum rods 103' may be formed respectively in the gaps formed by the third electrodes 1061 and the fourth electrodes 1062, to allow the directional arrangement of the plurality of quantum rods.

For example, the quantum rods 103' have a rod shape with a major axis and a minor axis. The quantum rods 103' are arranged such that the major axes of the quantum rods 103' are in parallel with the direction of the electric field formed between the third electrode 1061 and the fourth electrode 1062. That is, the major axes of the quantum rods 103' are arranged along a direction perpendicular to the extending direction of the third electrode 1061 and the fourth electrode 1062.

For example, when the third electrode 1061 and the fourth electrode 1062 positioned in the same layer are disposed in a layer different from that of the quantum rod light emitting layer 103, as in the embodiment shown by FIG. 4, the third electrode 1061 and the fourth electrode 1062 may be directly disposed on the substrate 101, a first insulating layer 105 is disposed on the third electrode 1061 and the fourth electrode 1062, and then the first electrode 102, the quantum rod light emitting layer 103 and the second electrode 104 are sequentially disposed on the first insulating layer 105.

Figure 7:
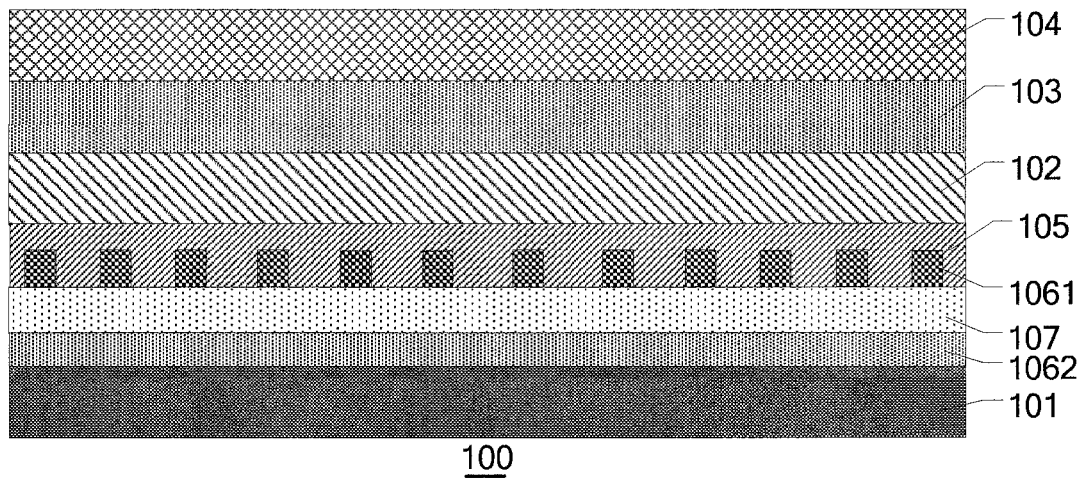
FIG. 7 is a schematic sectional view of yet another light emitting diode provided in one embodiment of the present disclosure.

For example, FIG. 7 is a schematic sectional view of another light emitting diode provided in one embodiment of the present disclosure. As shown in FIG. 7, the third electrode 1061 and the fourth electrode 1062 are disposed in different layers, and the third electrode 1061 and the fourth electrode 1062 are separated by a second insulating layer 107.

Figure 8:
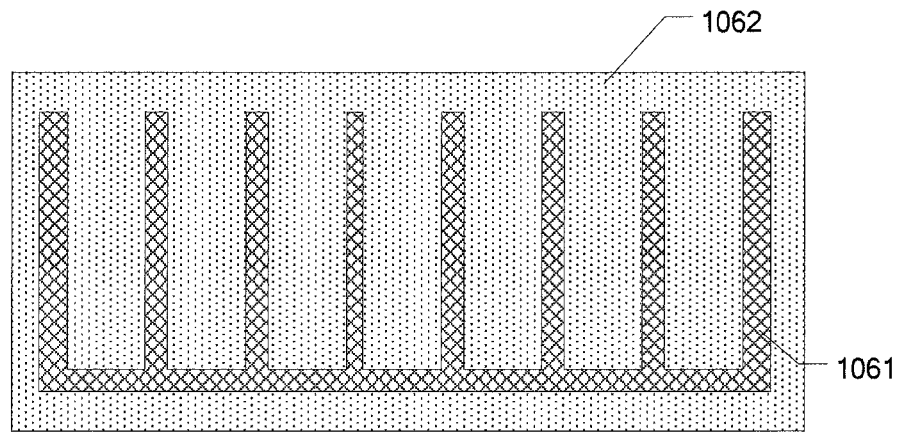
FIG. 8 is a schematic planar structural diagram of the third electrode and the fourth electrode in FIG. 7.

For example, FIG. 8 is a schematic planar structural diagram of the third electrode and the fourth electrode in FIG. 7. FIG. 8 is also a schematic diagram of an electrode structure similar with the display mode of IPS/FFS. As shown in FIG. 7 and FIG. 8, the third electrode 1061 is a slit-shaped electrode, the fourth electrode 1062 is a plate-shape electrode, and the third electrode 1061 and the fourth electrode 1062 are disposed oppositely. In each area, there are gaps between respective third electrodes 1061. The third electrode 1061 is formed above the fourth electrode 1062, and is opposite to the fourth electrode 1062. Likewise, after different voltages are applied to the third electrode 1061 and the fourth electrode 1062 respectively, an electric field in parallel with the substrate can be formed between them, thereby allowing the plurality of quantum rods in the quantum rod light emitting layer 103 to be arranged directionally.

For example, in the light emitting diode provided in at least one embodiment of the present disclosure, the third electrode 1061 and the quantum rod light emitting layer 103 are disposed in the same layer, or the third electrode 1061 and the fourth electrode 1062 are disposed on one side of the quantum rod light emitting layer 103 close to the substrate 101.

For example, the process for allowing the quantum rods to be arranged directionally comprises: applying a positive voltage and a negative voltage respectively to the third electrode 1061 and the fourth electrode 1062 to generate an uniform electric field between the third electrode 1061 and the fourth electrode 1062. Under the action of the uniform electric field, the plurality of quantum rods in the quantum rod light emitting layer are arranged directionally. After fixing the plurality of quantum rods to keep them in directional arrangement, the plurality of quantum rods presenting a directional arrangement are obtained.

By applying a voltage to the quantum rod light emitting layer formed from the plurality of quantum rods with the first electrode 102 and the second electrode 104, a polarized light required for achieving image display can be produced, without any additional backlight source. This is beneficial for simplifying the fabrication process of the device, reducing the production cost, and enables thinning and light-weight design of the display device.

Further, during the fabrication of a liquid crystal display panel, it is usually required to attach a polarizer beneath the array substrate directly, and damage may be caused to the liquid crystal display panel during the attachment. If the light emitting diode in the embodiment of the present disclosure is used as a backlight source of the liquid crystal display panel, the process of attaching a polarizer on the array substrate can be omitted, thereby avoiding the occurrence of the phenomenon that the attachment process causes damage to the liquid crystal display panel.

Figure 9:
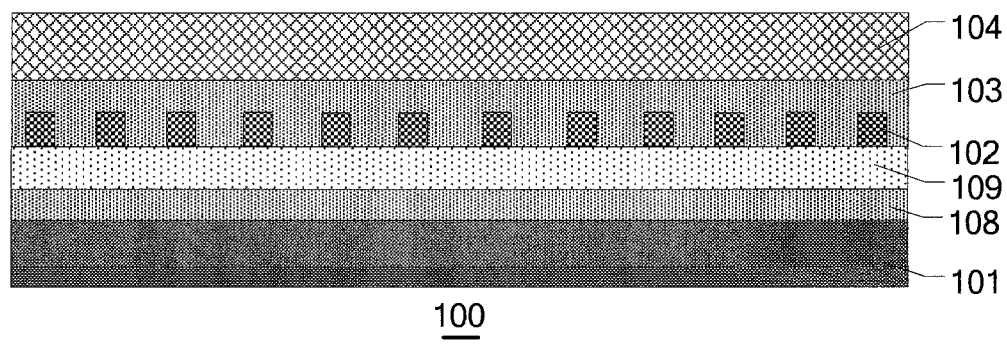
FIG. 9 is a schematic sectional view of yet another light emitting diode provided in one embodiment of the present disclosure.

For example, FIG. 9 is a schematic sectional view of yet another light emitting diode provided in one embodiment of the present disclosure. As shown in FIG. 9, the light emitting diode further comprises a fifth electrode 108, wherein the fifth electrode 108 and the first electrode 102 generate an electric field in parallel with or substantially in parallel with a plane of the substrate 101 in a powered state. For example, the first electrode 102 is a slit-shaped electrode, the fifth electrode 108 is a plate-shaped electrode, and a third insulating layer 109 is disposed between the first electrode 102 and the fifth electrode 108. In the embodiment, the first electrode 102 has two functions, that is, during the preparation process, it is used as one of electrodes for generating a horizontal electric field, which cooperates with the fifth electrode 108 to generate a horizontal electric field for directionally arranging the quantum rods, and during the working process, it cooperates with the second electrode 104 to apply a voltage to the quantum rod light emitting layer to make it emit light.

Figure 10:
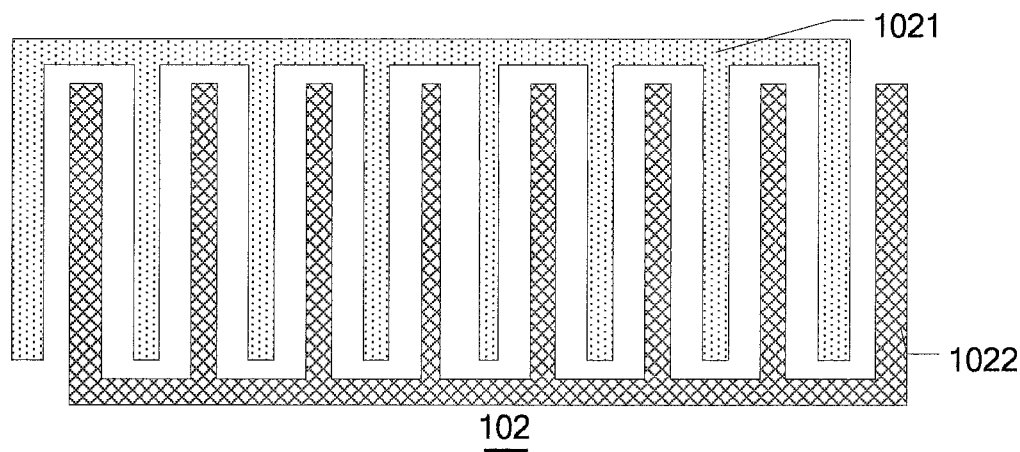
FIG. 10 is a schematic planar structural diagram of the first electrode in FIG. 9.

For example, FIG. 10 is a schematic planar structural diagram of a first electrode provided in one embodiment of the present disclosure. As shown in FIG. 10, the first electrode 102 may also be used as an electrode for generating a horizontal electric field. The first electrode 102 comprises a first sub-electrode 1021 and a second sub-electrode 1022, wherein the first sub-electrode 1021 and the second sub-electrode 1022 are disposed in the same layer, and are configured to generate an electric field in parallel with or substantially in parallel with a plane of the substrate 101 in a powered state.

For the principle of achieving the directional arrangement of the quantum rods by the structures shown in FIG. 9 and FIG. 10, reference can be made to related description in the above description, and it will not be reiterated here.

Figure 11:
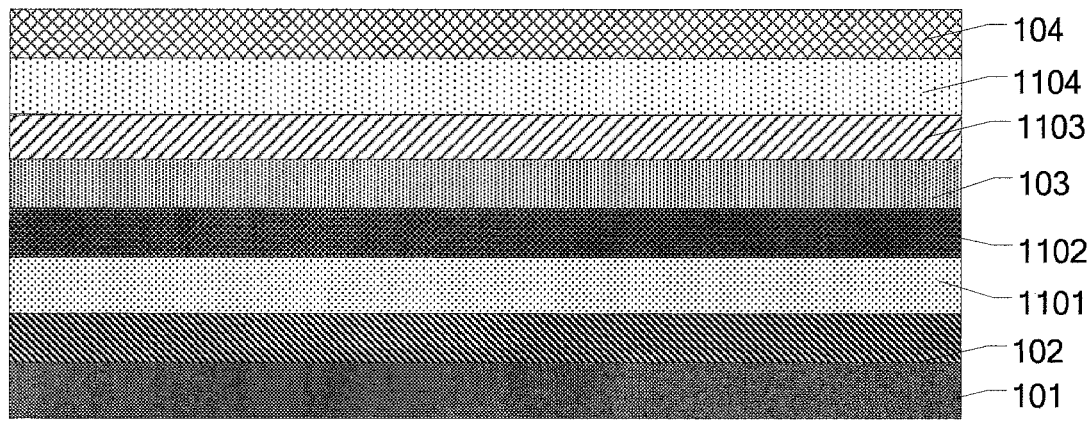
FIG. 11 is a schematic sectional view of yet another light emitting diode provided in one embodiment of the present disclosure.

For example, FIG. 11 is a schematic sectional view of yet another light emitting diode provided in one embodiment of the present disclosure. As shown in FIG. 11, the light emitting diode further comprises a functional layer positioned between the first electrode 102 and the quantum rod light emitting layer 103 and/or between the second electrode 104 and the quantum rod light emitting layer 103. The functional layer includes a hole injection layer 1101, a hole transport layer 1102 or an electron transport layer 1103 disposed on the substrate 101. The functional layer 110 may further include an electron injection layer 1104 or the like. For example, the first electrode 102 is disposed between the substrate and the hole injection layer, and the second electrode 104 is disposed on one side of the electron transport layer away from the substrate. The hole injection layer and the hole transport layer are beneficial for a hole to be injected from an anode and to be transported to the quantum rod light emitting layer, thereby improving the luminescence efficiency. The electron transport layer and the electron injection layer are beneficial for an electron to be injected from a cathode and to be transported to the quantum rod light emitting layer, thereby improving the luminescence efficiency.

As shown in FIG. 11, the light emitting diode comprises the first electrode 102, the hole injection layer 1101, the hole transport layer 1102, the quantum rod light emitting layer 103, the electron transport layer 1103, the electron injection layer 1104 and the second electrode 104 disposed sequentially in lamination from bottom to top.

For example, the material of the substrate 101 includes a transparent glass, a ceramic or a metal. The substrate may also be a flexible substrate.

For example, as the material of the first electrode 102, at least one of a conductive metal oxide, graphene, carbon nanotube, a high work function metal and a conductive polymer may be used. For example, the first electrode 102 has a thickness of 100 nm to 1000 nm, such as 300 nm to 600 nm.

For example, the material of the hole injection layer 1101 may be an organic material, such as at least one of poly(3,4-ethylenedioxythiophene)-polystyrenesulfonate (PEDOT/PSS), polythiophene and polyaniline, tri-[4-(5-phenyl-2-thienyl)phenyl]amine, 4,4',4''-tri[2-naphthyl(phenyeamino]triphenylamine (2-TNATA), 4,4',4''-tri-(3-methylphenylanilino)triphenylamine (m-MTDATA), copper phthalocyanide (CuPc) and TPD. The material of the hole injection layer may be an inorganic material, such as at least one of molybdenum oxide, vanadium oxide, tungsten oxide, chromium oxide, molybdenum disulfide, tungsten disulfide, molybdenum selenide, and tungsten diselenide. For example, the hole injection layer 1101 has a thickness of 1 nm to 200 nm, such as 10 nm to 150 nm.

For example, the hole transport layer 1102 has a thickness of 10 nm to 180 nm, and the material of the hole transport layer 1102 includes polytriphenylamine.

For example, the electron transport layer 1103 has a thickness of 10 nm to 35 nm. The material of the electron transport layer 1103 may be an organic material, such as 8-hydroxyquinoline-aluminum; or the material of the electron transport layer 1103 may be an inorganic material, such as at least one of ZnO, $TiO_2$, SnO, $ZrO_2$, $Ta_2O_3$, AlZnO, ZnSnO and InSnO.

For example, the material of the electron injection layer 1104 comprises any one or a combination of LiF and 8-hydroxyquinoline-lithium. The electron injection layer may also employ an alkaline metal oxide, other alkaline metal fluoride, or the like. The alkaline metal oxide includes lithium oxide ($Li_2O$), lithium boron oxide ($LiBO_2$), potassium silicate ($K_2SiO_3$), cesium carbonate ($Cs_2CO_3$) and the like; and the alkaline metal fluoride includes sodium fluoride (NaF) and the like.

It should be noted that one of the first electrode 102 and the second electrode 104 is an anode, and the other is a cathode. In addition to the above embodiment in which the first electrode 102 is an anode and the second electrode 104 is a cathode, it is also possible that the first electrode 102 is a cathode and the second electrode 104 is an anode. The electrode material of anode includes a transparent conducting material such as indium tin oxide, zinc oxide and the like. The electrode material of cathode includes aluminum, magnesium, or an alloy material of them.

The light emitting diode provided in at least one embodiment of the present disclosure can emit a polarized light. Unlike the design of using a polarizer to produce a polarized light, the light intensity of the polarized light formed with the quantum rod light emitting layer will not substantially decrease in the embodiments of the present disclosure.

Figure 12:
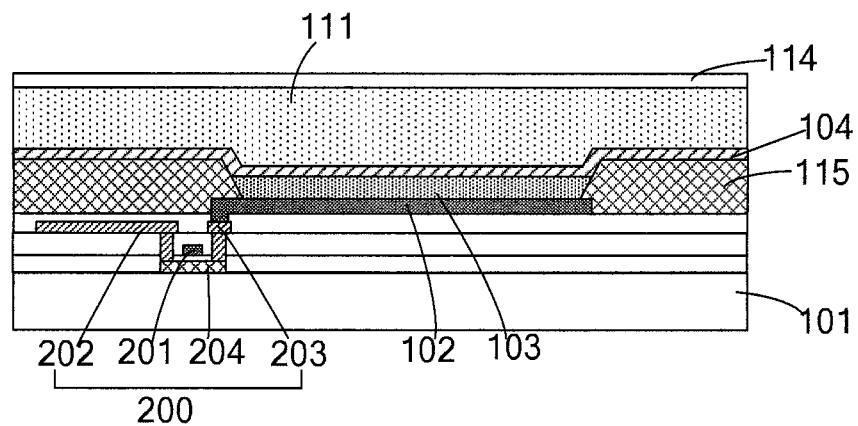
FIG. 12 is a schematic sectional view of a quantum rod/dot light emitting diode (QLED) array substrate provided in one embodiment of the present disclosure.

For example, at least one embodiment of the present disclosure also provides a light emitting diode (QLED) array substrate. When the light emitting diode (QLED) is used in the structure of an array substrate, as shown in FIG. 12, the QLED array substrate comprises a substrate 101, and a driving transistor 200, a first electrode 102, a second electrode 104, and a quantum rod light emitting layer 103 between the first electrode 102 and the second electrode 104, which are disposed on the substrate 101. The quantum rod light emitting layer 103 can emit a polarized light, and for example, it comprises a plurality of quantum rods directionally arranged. The driving transistor 200 comprises a gate electrode 201, a source electrode 202, a drain electrode 203 and an active layer 204, and the first electrode 102 is electrically connected with the source electrode 202 or the drain electrode 203. In FIG. 12, the first electrode 102 is electrically connected with the drain electrode 203.

For example, the QLED array substrate further comprises a pixel defining layer 115 formed between the first electrode 102 and the second electrode 104, and the pixel defining layer 115 can be used for separating two adjacent sub-pixel units. The pixel defining layer 115 is usually formed from an organic insulating material (such as acrylic resin) or an inorganic insulating material (such as silicon nitride ($SiN_x$) or silicon oxide ($SiO_x$), so the pixel defining layer 115 has an insulating property. The pixel defining layer 115 comprises a groove, and the quantum rod light emitting layer 103 and the functional layer are formed in the groove.

Since water, oxygen or the like has a great influence on the properties of the cathode and the functional layer, a passivation layer 111 and a packaging layer 114 may also be disposed on the second electrode 104 of the QLED array substrate, as shown in FIG. 12.

For example, the material of the passivation layer 111 may be silicon nitride ($SiN_x$), silicon oxide ($SiO_x$), acrylic resin, or the like.

For example, the material of the packaging layer 114 includes a single film layer or a composite film layer formed from silicon nitride, silicon oxide, or photosensitive resin. For example, the photosensitive resin may be polyacrylic resin, polyimide resin, polyamide resin or the like.

Figure 13:
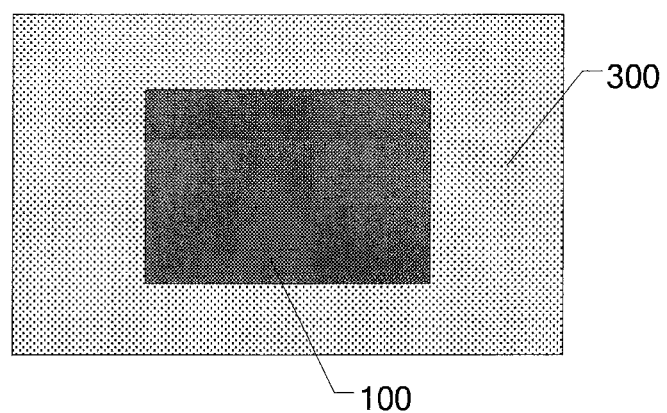
FIG. 13 is a block diagram of an electronic device provided in one embodiment of the present disclosure.

At least one embodiment of the present disclosure further provides an electronic device. For example, FIG. 13 is a block diagram of an electronic device provided in one embodiment of the present disclosure. The electronic device 300 comprises any light emitting diode 100 described above. For example, the electronic device includes a display device and a lighting device.

For example, the display device may be a product or part having a display function, such as an electronic paper, a QLED panel, a digital photo frame, a mobile phone, a tablet computer and the like, or an electronic equipment such as an X-ray detector and the like.

When the electronic device is a display device, it can be classified into a single-side light emitting display device and a double-side light emitting display device depending on the materials of the anode and the cathode of the light emitting diode. That is, when the material of one electrode of the anode and the cathode is an opaque or translucent material, the display device is a single-side light emitting type; and when the materials of both the anode and the cathode are transparent and/or translucent materials, the display device is a double-side light emitting type.

The single-side light emitting display device can in turn be classified into a top light emitting type and a bottom light emitting type, depending on the materials of the anode and the cathode. In the case that the anode is disposed close to the substrate, and the cathode is disposed away from the substrate, when the material of the anode is a transparent conducting material and the material of the cathode is an opaque conducting material, the display device can be referred to as a bottom light emitting type because the emitted light exits from the substrate side via the anode; and when the material of the anode is an opaque conducting material and the material of the cathode is a transparent or translucent conducting material, the display device can be referred to as a top light emitting type because the emitted light exits from one side of the cathode away from the substrate. The two relative positions of the anode and cathode as above may be interchanged, and it will not be reiterated here.

For a double-side light emitting display device, when the anode is disposed close to the substrate, the cathode is disposed away from the substrate, and the materials of both the anode and the cathode are transparent conducting and/or translucent materials, the display device can be referred to as a double-side light emitting type, because the emitted light exits from the substrate side via the anode, and also exits from one side of the cathode away from the substrate. Here, it is also possible that the anode is disposed away from the substrate and the cathode is disposed close to the substrate.

At least one embodiment of the present disclosure also provides a preparation method of a light emitting diode, comprising: providing a substrate; and forming a first electrode, a quantum rod light emitting layer and a second electrode in lamination on the substrate. For example, the quantum rod light emitting layer comprises a plurality of quantum rods which present a directional arrangement.

For example, the directional arrangement of the plurality of quantum rods comprises a directional arrangement in which the plurality of quantum rods are in parallel with a plane of the substrate, a directional arrangement in which the plurality of quantum rods are acute-angled to the plane of the substrate, or a directional arrangement in which the plurality of quantum rods are perpendicular to the plane of the substrate.

For example, the method of preparing a light emitting diode further comprises forming a third electrode and a fourth electrode opposite to each other on the substrate. The third electrode and the fourth electrode are configured to generate an electric field in parallel with or substantially in parallel with a plane of the substrate in a powered state.

For example, the method of preparing a light emitting diode further comprises forming a functional layer positioned between the first electrode and the quantum rod light emitting layer or between the second electrode and the quantum rod light emitting layer on the substrate. The functional layer comprises a hole injection layer, a hole transport layer, an electron injection layer or an electron transport layer.

For example, the steps of forming a display panel comprising the above light emitting diode may comprises the following steps: washing a substrate with a standard method, depositing a gate metal thin film on the washed substrate, for example, the material of the gate metal being molybdenum (Mo), copper (Cu) or the like, and for example, the thickness of the gate metal thin film being 200 nm to 500 nm, and then patterning the gate metal thin film to form a gate electrode pattern; depositing a gate insulating layer thin film on the gate electrode pattern to form a gate insulating layer, for example, the material of the gate insulating layer being silicon nitride ($SiN_x$), silicon oxide ($SiO_x$) or the like, and the thickness being 150 nm to 400 nm; depositing an active layer on the gate insulating layer, and patterning it to form an active layer pattern, for example, the material of the active layer including indium tin oxide (ITO), indium zinc oxide (IZO), indium gallium oxide (IGO), gallium zinc oxide (GZO), zinc oxide (ZnO), and indium gallium zinc oxide (IGZO), and the thickness of the active layer being 40 nm to 100 nm; depositing a source/drain electrode metal thin film on the active layer pattern, and patterning it to form a source electrode and drain electrode pattern, for example, the material of the source electrode and drain electrode being molybdenum (Mo), and the thickness of the source electrode and drain electrode being 200 nm to 500 nm; depositing a passivation layer on the source electrode and drain electrode, the material of the passivation layer being silicon nitride ($SiN_x$), silicon oxide ($SiO_x$), acrylic resin, or the like, and for example, the thickness of the passivation layer being 300 nm to 350 nm; depositing a transparent conducting thin film on the passivation layer, and patterning it to form a pixel electrode pattern, for example, the material of the pixel electrode being indium tin oxide (ITO), and the thickness of the pixel electrode being 40 nm to 100 nm; and spin-coating and depositing an acrylic material on the pixel electrode, photoetching and solidifying it to form a pixel defining layer, for example, the thickness of the pixel defining layer being 0.7 μm to 1.5 μm, to complete the preparation of a back panel portion of TFT.

For example, quantum rods in which the core is formed from a mixed semiconductor material of $CsPbI_3$ and CdSe—CdS and the shell is formed from CdS are prepared, and dispersed in a solvent such as toluene and the like. The mass percentage of the quantum rods after solidification is 3 wt %.

The back panel surface of TFT is treated with plasma before preparing the quantum rod light emitting diode, and then a hole injection layer and a hole transport layer are prepared by an inkjet printing process, for example, respectively with poly(3,4-ethylenedioxythiophene) (PEDOT) and polystyrenesulfonate (PSS) and the like, and the entire thickness thereof is 50 nm to 100 nm. Quantum rods with various colors are then printed, and placed in a vacuum oven to dry and solidify them after the completion of printing. After that, an electron transport layer is formed, then a cathode metal thin layer is formed by evaporation deposition, e.g. a LiF:Al layer or the like may be used as the material of the cathode, and the thickness of the cathode is 500 nm to 1000 nm. After the evaporation deposition, packaging and cutting are performed to complete the preparation of the whole display panel.

For example, reference can be made to related description in the above description for the step of forming the display panel by using the quantum rods formed from CdSe—CdS.

The embodiments of the present disclosure provide a light emitting diode and a preparation method thereof, an array substrate, and an electronic device. The light emitting diode can be applied in various cases requiring a polarized light. For example, when the light emitting diode is used in a liquid crystal display device as a backlight source or used in a 3D display in a polarized light mode, it can produce a polarized light, and at the same time it can achieve an image display with high luminance and high color gamut. When the light emitting diode is applied in a lighting device, for example, in outdoor lighting or automotive lighting, the luminance of lighting can be improved.

The following points should be noted.

(1) The drawings for the embodiments of the present disclosure only relate to the structures involved in the embodiments of the present disclosure, and reference can be made to usual designs for other structures.

(2) For clarity, in the drawings for illustrating the embodiments of the present disclosure, the thickness of a layer or of an area is enlarged or reduced, i.e., these drawings are not drawn according to the actual scale. It should be understood that when an element such as a layer, a film, an area or a substrate is referred to as being positioned "above" or "below" another element, the element may be directly positioned "above" or "below" the another element, or there may be an intermediate element.

(3) Unless contradiction, the embodiments of the present disclosure and the features in the embodiments can be combined with each other to obtain a new embodiment.

The above descriptions are only some particular embodiments of the present invention, and the protection scope of the present invention are not limited thereto. The protection scope of the present invention should be defined by the following claims.

What is claimed is:

1. A light emitting diode comprising:
   a substrate, and
   a first electrode, a quantum rod light emitting layer and a second electrode disposed in lamination on the substrate,
   wherein, the quantum rod light emitting layer comprises a plurality of quantum rods which present a directional arrangement,
   wherein the light emitting diode further comprises a third electrode and a fourth electrode, the third electrode and the fourth electrode being configured to generate an electric field in parallel with or substantially in parallel with a plane of the substrate in a powered state, and
   wherein the third electrode is a comb-shaped electrode.

2. The light emitting diode according to claim 1, wherein, the directional arrangement comprises a directional arrangement in which the plurality of quantum rods are in parallel with a plane of the substrate, a directional arrangement in which the plurality of quantum rods are acute-angled to the plane of the substrate, or a directional arrangement in which the plurality of quantum rods are perpendicular to the plane of the substrate.

3. The light emitting diode according to claim 1, wherein, an aspect ratio of each of the quantum rods is 2 to 50.

4. The light emitting diode according to claim 1, wherein, the third electrode and the fourth electrode are disposed in the same layer and both are comb-shaped electrodes, and the third electrode and the fourth electrode are disposed oppositely and are staggered.

5. The light emitting diode according to claim 4, wherein, the third electrode and the quantum rod light emitting layer are disposed in the same layer or in different layers.

6. The light emitting diode according to claim 1, wherein, the third electrode and the fourth electrode are disposed in different layers, and the fourth electrode is a plate-shaped electrode.

7. The light emitting diode according to claim 6, wherein, the third electrode and the quantum rod light emitting layer are disposed in the same layer, or both the third electrode and the fourth electrode are disposed on one side of the quantum rod light emitting layer close to the substrate.

8. The light emitting diode according to claim 1, further comprising a functional layer positioned between the first electrode and the quantum rod light emitting layer or between the second electrode and the quantum rod light emitting layer, wherein, the functional layer comprises at least one of a hole injection layer, a hole transport layer, an electron injection layer and an electron transport layer.

9. The light emitting diode according to claim 8, wherein, the first electrode is disposed between the substrate and the hole injection layer, and the second electrode is disposed on one side of the electron transport layer away from the substrate.

10. A light emitting diode array substrate comprising the light emitting diode according to claim 1.

11. The light emitting diode array substrate according to claim 10, further comprising a pixel defining layer, wherein, the pixel defining layer comprises a groove, and the quantum rod light emitting layer is formed in the groove.

12. An electronic device comprising the light emitting diode array substrate according to claim 10.

13. A preparation method of the light emitting diode of claim 1, comprising:
    providing the substrate; and
    forming the first electrode, the quantum rod light emitting layer and the second electrode in lamination on the substrate.

14. The preparation method according to claim 13, further comprising forming a functional layer positioned between the first electrode and the quantum rod light emitting layer or between the second electrode and the quantum rod light emitting layer on the substrate, wherein, the functional layer comprises at least one of a hole injection layer, a hole transport layer, an electron injection layer and an electron transport layer.

15. The preparation method according to claim 13, wherein, the quantum rod light emitting layer is formed with a coating or inkjet process, and an electric field in a predetermined direction is applied such that the plurality of quantum rods in the quantum rod light emitting layer present a directional arrangement, then the quantum rod light emitting layer is dried and solidified to fix the directional arrangement of the quantum rods in the quantum rod light emitting layer.

16. A light emitting diode comprising:
    a substrate, and
    a first electrode, a quantum rod light emitting layer and a second electrode disposed in lamination on the substrate,
    wherein, the quantum rod light emitting layer comprises a plurality of quantum rods which present a directional arrangement,
    wherein the first electrode is a comb-shaped electrode;
    wherein the first electrode comprises a first sub-electrode and a second sub-electrode; and
    wherein the first sub-electrode and the second sub-electrode are disposed in the same layer, and are configured to generate an electric field in parallel with or substantially in parallel with a plane of the substrate in a powered state.

17. The light emitting diode according to claim 16, further comprising a functional layer positioned between the first electrode and the quantum rod light emitting layer or between the second electrode and the quantum rod light emitting layer, wherein the functional layer comprises at least one of a hole injection layer, a hole transport layer, an electron injection layer and an electron transport layer.

18. A light emitting diode comprising:
    a substrate, and
    a first electrode, a quantum rod light emitting layer and a second electrode disposed in lamination on the substrate,
    wherein, the quantum rod light emitting layer comprises a plurality of quantum rods which present a directional arrangement,
    wherein the first electrode is a comb-shaped electrode;
    wherein the light emitting diode further comprises a fifth electrode; and
    wherein the fifth electrode and the first electrode generate an electric field in parallel with or substantially in parallel with a plane of the substrate in a powered state.

19. The light emitting diode according to claim 18, wherein the first electrode and the fifth electrode are disposed in different layers, and the fifth electrode is a plate-shaped electrode.

20. The light emitting diode according to claim 18, further comprising a functional layer positioned between the first electrode and the quantum rod light emitting layer or between the second electrode and the quantum rod light emitting layer, wherein the functional layer comprises at least one of a hole injection layer, a hole transport layer, an electron injection layer and an electron transport layer.

* * * * *